US007041427B2

(12) United States Patent
Loccufier et al.

(10) Patent No.: US 7,041,427 B2
(45) Date of Patent: May 9, 2006

(54) HEAT-SENSITIVE LITHOGRAPHIC PRINTING PLATE PRECURSOR

(75) Inventors: Johan Loccufier, Zwijnaarde (BE); Marc Van Damme, Bonheiden (BE); Joan Vermeersch, Deinze (BE); Wim Sap, Brugge (BE)

(73) Assignee: Agfa Gevaert, Mortsel (BE)

(*) Notice: Subject to any disclaimer, the term of this patent is extended or adjusted under 35 U.S.C. 154(b) by 9 days.

(21) Appl. No.: 10/256,527

(22) Filed: Sep. 27, 2002

(65) Prior Publication Data

US 2003/0091932 A1 May 15, 2003

Related U.S. Application Data

(60) Provisional application No. 60/329,971, filed on Oct. 16, 2001.

(30) Foreign Application Priority Data

Sep. 27, 2001 (EP) ................................. 01203681

(51) Int. Cl.
*G03F 7/004* (2006.01)

(52) U.S. Cl. ............................... 430/270.1; 430/271.1; 430/273.1; 430/964; 430/157

(58) Field of Classification Search ............. 430/270.1, 430/271.1, 273.1, 964, 157
See application file for complete search history.

(56) References Cited

U.S. PATENT DOCUMENTS

| | | | | |
|---|---|---|---|---|
| 3,929,488 | A | 12/1975 | Smith | |
| 5,310,618 | A | 5/1994 | Kawamura | |
| 5,362,812 | A * | 11/1994 | Holmes et al. | 525/274 |
| 5,741,620 | A * | 4/1998 | Holmes et al. | 430/253 |
| 6,124,425 | A * | 9/2000 | Nguyen | 528/422 |
| 6,506,533 | B1 * | 1/2003 | Kottmair et al. | 430/190 |
| 6,558,872 | B1 * | 5/2003 | Ray et al. | 430/271.1 |
| 6,667,137 | B1 * | 9/2003 | Kottmair et al. | 430/18 |
| 6,777,164 | B1 * | 8/2004 | Horne et al. | 430/278.1 |

FOREIGN PATENT DOCUMENTS

| | | | |
|---|---|---|---|
| DE | DD 275 125 | A1 | 1/1990 |
| EP | 1 110 747 | A1 | 6/2001 |
| EP | 1 186 955 | A2 | 3/2002 |
| WO | WO 91/19227 | A1 | 12/1991 |

OTHER PUBLICATIONS

European Search Report 01 20 3681 (Apr, 12, 2002).

* cited by examiner

*Primary Examiner*—Amanda Walke
(74) *Attorney, Agent, or Firm*—Leydig, Voit & Mayer, Ltd.

(57) ABSTRACT

A heat-sensitive lithographic printing plate precursor is disclosed comprising a polymer which is soluble in an aqueous alkaline solution and which comprises at least one chromophoric moiety having a light absorption maximum in the wavelength range between 400 and 780 nm. Such materials show no dye stain after processing in areas where the coating has been removed by an alkaline developer.

6 Claims, No Drawings

HEAT-SENSITIVE LITHOGRAPHIC PRINTING PLATE PRECURSOR

This application claims the benefit of U.S. Provisional Application No. 60/329,971 filed Oct. 16, 2001, which is herein incorporated by reference.

FIELD OF THE INVENTION

The present invention relates to a heat-sensitive positive- or negative-working lithographic printing plate precursor that requires aqueous alkaline processing.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer layers which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called 'negative-working'. Also positive-working materials, wherein the exposed areas define the non-printing areas, are known, e.g. plates having a novolac/naphtoquinone-diazide coating which dissolves in the developer only at exposed areas.

In addition to the above photosensitive materials, also heat-sensitive printing plate precursors have become very popular. Such thermal materials offer the advantage of daylight-stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by cross-linking of a polymer, decomposition, or particle coagulation of a thermoplastic polymer latex.

The coating of the known printing plate materials typically comprise an hydrophilic support and a coating containing an oleophilic polymer, which is alkali-soluble in exposed areas (positive working material) or in non-exposed areas (negative working material) and a colorant, which is often called contrast dye or indicator dye. The indicator dye provides a visible image after image-wise exposure and processing with aqueous, alkaline developers, which removes the oleophilic coating at the non-image (non-printing) areas of the plate. However, most contrast dyes are not or poorly soluble in the developer or are not completely compatible with the other ingredients in the layer, e.g. the oleophilic polymer, which may cause phase separation. As a result, the contrast dye is not completely removed from the support by the processing step and a dye stain is observed at the non-image areas which may disturb the printing process.

U.S. Pat. No. 6,124,425 discloses thermally reactive polymers wherein an infrared dye is covalently linked to the polymer backbone.

EP-A 934822 discloses a lithographic printing plate precursor comprising phenolic resins wherein the phenolic hydroxyl group is esterified with a sulfonic or carboxylic group containing compound for the purpose of providing higher resistance of the coating.

SUMMARY OF THE INVENTION

It is an aspect of the present invention to provide a solution for the above mentioned problem of dye stain due to incomplete removal, during processing with an aqueou alkaline developer, of the contrast dye in the coating of a heat-sensitive lithographic printing plate precursor. This problem is solved by the precursor defined in claim 1. Preferred embodiments are defined in the dependent claims. By linking the dye with a covalent bond to an alkali-soluble polymer, dye stain is avoided completely. The polymer is not necessarily oleophilic, since it can also be combined with an oleophilic polymer such as a phenolic resin. In a more preferred embodiment, the polymer itself is oleophilic so that it can be used as the sole binder of the oleophilic layer.

DETAILED DESCRIPTION OF THE INVENTION

The polymer that is present in the coating of the lithographic printing plate precursor of the present invention, comprises at least one chromophoric moiety which absorbs visible light, more specifically a moiety which has a light absorption maximum in the wavelength range between 400 and 780 nm, more preferably between 430 and 780 nm and most preferably between 470 and 750 nm. The polymer is soluble in an aqueous alkaline solution, more specifically in an amount sufficient to provide at room temperature an alkaline solution of dissolved polymer at a concentration of at least 1 g/l, preferably at least 10 g/l. The pH of the solution is at least 7.0, more preferably at least 8.5 and most preferably at least 10.0. The molecular weight of the polymer is preferably larger than 1500 g/mol.

The chromophoric moiety corresponds to one of the following formulae I to VI:

(I)

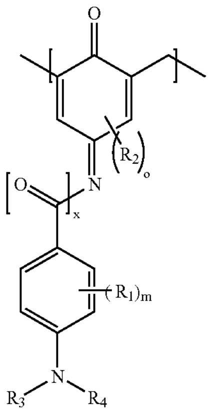

(II)

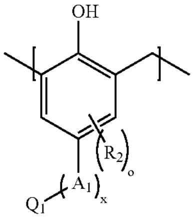

(III)

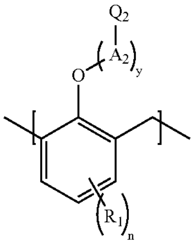

(IV)

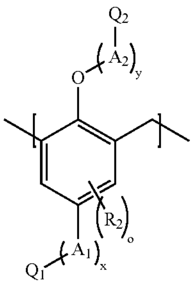

(V)

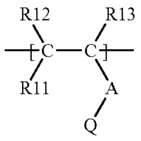

-continued (VI)

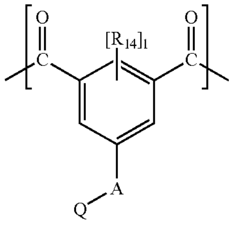

wherein l is 0 to 3;

m 0 to 4;

n is 0 to 3;

o is 0 to 2;

x and y are independently 0 or 1;

each $R_1$ and $R_2$ is independently selected from the group consisting of alkyl, aryl, —$G_1$, —$L_1$—$G_1$, —CN, a halogen, —$NO_2$, —$OR_a$, —CO—$R_d$, —CO—O—$R_a$, —O—CO—$R_d$, —CO—$NR_dR_e$, —$NR_dR_e$, —$NR_d$—CO—$R_e$, —$NR_d$—CO—O—$R_a$, —$NR_d$—CO—$NR_eR_f$, —$SR_a$, —SO—$R_a$, —$SO_2$—$R_a$, —$SO_2$—O—$R_a$, —$SO_2$—$NR_aR_b$ or wherein two adjacent radicals $R_1$ together form a condensed carbocyclic or heterocyclic ring;

each $R_3$ and $R_4$ is independently selected from the group consisting of hydrogen, alkyl, aryl, —CO—$R_d$, —CO—O—$R_b$, —CO—$NR_gR_h$ and —$L_2$—$G_2$;

R11, R12 and R13 are independently selected from the group consisting of hydrogen, alkyl or aryl;

each R14 is independently selected from alkyl or aryl

Q, $Q_1$ and $Q_2$ are chromophoric groups wherein $Q_2$ comprises at least one solubilizing group $G_3$;

with

A, $A_1$, $A_2$, $L_1$ and $L_2$ being a divalent linking group;

$G_1$, $G_2$ and $G_3$ being a solubilizing group selected from —COOH, —$PO_3H_2$, —O—$PO_3H_2$, —$SO_3H$, —O—$SO_3H$, —$SO_2$—$NH_2$, —$SO_2$—NH—$R_c$, —$SO_2$—NH—CO—$R_c$ and salts thereof;

$R_a$, $R_b$ and $R_c$ being an alkyl or an aryl group;

$R_d$, $R_e$, $R_f$, $R_g$ and $R_h$ being hydrogen, an alkyl or an aryl group.

Preferred divalent linking groups are —O—, —CO—, —CO—NR'—, —CO—O—, —N═N—, —NR'—, —NR'—CO—O—, —NR'—CO—NR"—, —S—, —SO—, —$SO_2$—, —$SO_2$—O—, —$SO_2$—NR'—, arylene or alkylene, wherein R' and R" are independently hydrogen, alkyl or aryl.

In the above formula, the chromophoric moiety is either part of the polymer backbone itself or is a pending group which is connected to the polymer backbone by means of a linking group. When the linking groups, such as the A or L groups in the above formulae, connect the conjugated system of a pending chromophoric group, such as the Q, $Q_1$ and $Q_2$ groups in the above formulae, to another conjugated system which is part of the polymer backbone, then it is shall be understood that the term "chromophoric moiety" in the meaning of the present invention refers to the conjugated system as a whole: the light absorption of the polymer then originates from the complete conjugated system formed by the pending group, the linking group and the conjugated group that is part of the polymer backbone. Alternatively, the conjugated system of a pending chromophoric group can be isolated either because the linking group contains only single bonds or because there is no conjugated system in the polymer backbone itself and in that embodiment the term "chromophoric moiety" corresponds to the pending group only.

The polymer can be a homopolymer or a random, an alternating, a block- or graft-copolymer of different monomers. The polymer may contain various chromophoric moieties and/or various solubilizing groups which can be attached, either directly or by a linking group, to the chromophoric group and/or to other monomeric units of the polymer. The solubilizing groups are anionic or can be rendered anionic by immersion of the polymer in an aqueous alkaline solution in an amount sufficient to render the polymer soluble in the aqueous alkaline solution. In the above formula (III) and (IV), $Q_2$ comprises at least one solubilizing group for obtaining a sufficient solubility in aqueous alkaline solutions.

Useful chromophoric groups Q, $Q_1$ and $Q_2$ correspond to the dyes given in The Chemistry and Application of Dyes, edited by D. R. Waring and G. Hallas (Plenum Press New York and London, 1990). Suitable dye classes can be selected from the group consisting of indoaniline dyes, azomethine dyes, azo dyes, di- and triaryl carbonium dyes and their heteroatomic counterparts, anthraquinone dyes, benzodifuranone dyes, polycyclic aromatic carbonyl dyes, indigoid dyes, cyanines, oxonoles, hemicyanines, azacarbocyanines, merocyanines, hemicyanines, carbostyryl dyes, phthalocyanines, quinophtalones, nitro and nitroso dyes, formazan dyes and stylbene dyes. The dyes can also be complexes of transition metals, typically e.g. copper or iron complexes. Most preferably, the chromophoric moiety is derived from indoaniline dyes, azomethine dyes, azo dyes or anthraquinone dyes.

Specific examples of chromophoric groups Q, $Q_1$ or $Q_2$ are the following:

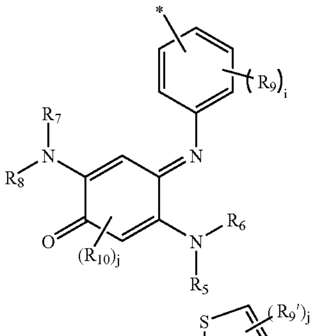

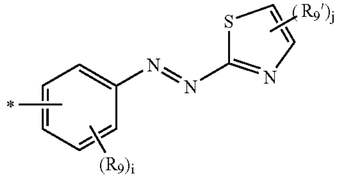

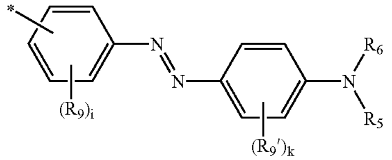

-continued

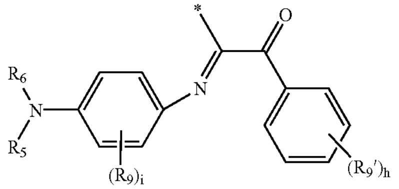

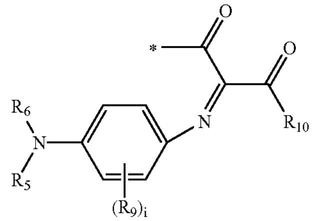

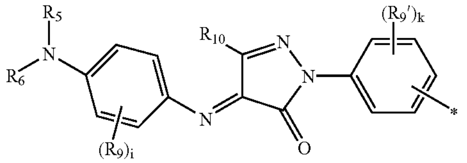

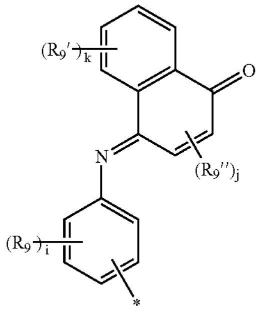

wherein h is 0 to 5;

i and k are independently 0 to 4;

j is 0 to 2;

* represents the bond between the chromophoric group and the polymer or the optional linking group;

each $R_9$, $R_9'$, $R_9''$ and $R_{10}$ is independently selected from the group consisting of alkyl, aryl, $-G_1'$, $-L_1'-G_1'$, $-CN$, a halogen, $-NO_2$, $-OR_a'$, $-CO-R_d'$, $-CO-O-R_a'$, $-O-CO-R_d'$, $-CO-NR_d'R_e'$, $-NR_d'R_e'$, $-NR_d'-CO-R_e'$, $-NR_d'-CO-O-R_a'$, $-NR_d'-CO-NR_e'R_f'$, $-SR_a'$, $-SO-R_a'$, $-SO_2-R_a'$, $-SO_2-O-R_a'$, $-SO_2-NR_a'R_b'$ or wherein two adjacent radicals $R_9$, $R_9'$ or $R_9''$ together form a condensed carbocyclic or heterocyclic ring;

each $R_5$, $R_6$, $R_7$ and $R_8$ is independently selected from the group consisting of hydrogen, alkyl, aryl, $-CO-R_d'$, $-CO-O-R_b'$, $-CO-NR_g'R_h'$ and $-L_2'-G_2'$;

with $L_1'$ and $L_2'$ being a divalent linking group;

$G_1'$ and $G_2'$ being a solubilizing group selected from $-COOH$, $-OH$, $-PO_3H_2$, $-O-PO_3H_2$, $-SO_3H$, $-O-SO_3H$, $-SO_2-NH_2$, $-SO_2-NH-R_c'$, $-SO_2-NH-CO-R_c'$ and salts thereof;

$R_a'$, $R_b'$ and $R_c'$ being an alkyl or an aryl group;

$R_d'$, $R_e'$, $R_f'$, $R_g'$ and $R_h'$ being hydrogen, an alkyl or an aryl group.

In a particular embodiment, the polymer is a copolymer consisting of one or more monomeric units D, which may be the same or different and each contain a chromophoric moiety as defined above, and one or more other monomeric units M, which may also be the same or different. The molar ratio of the monomeric units D vs. the monomeric units M is preferably less than 1:5, more preferably less than 1:10 and most preferably less than 1:15.

Suitable examples of M are (meth)acrylic acid and amides or alkyl esters thereof, acrylonitrile, styrene, styrene sulfonic acid, 4-carboxystyrene, 4-hydroxystyrene, sulfoalkyl-methacrylates, acrylamidoglycolic acid, 2-acrylamido-2-methylpropane sulfonic acid, itaconic acid, maleic acid and sulfo-isophtalic acid. A highly preferred embodiment of M corresponds to the following formula:

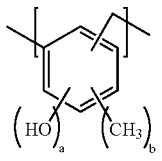

and more preferably to the following formula:

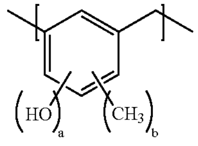

wherein a is 1 or 2 and b is 0 to 3. When the above unit M is present in a sufficient amount, the polymer is oleophilic. Such polymers of M are generally known as novolacs. Suitable examples of such copolymers include the following:

novolac I

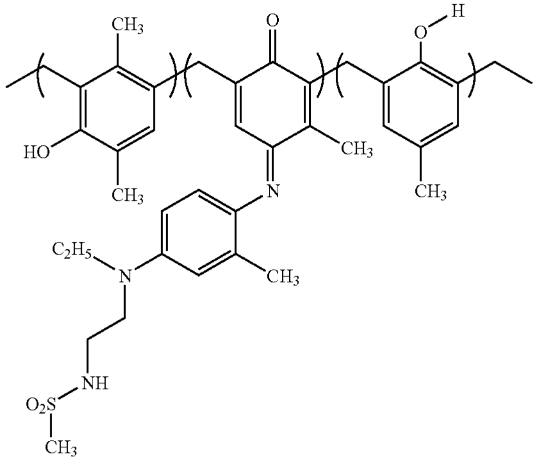

-continued novolac II

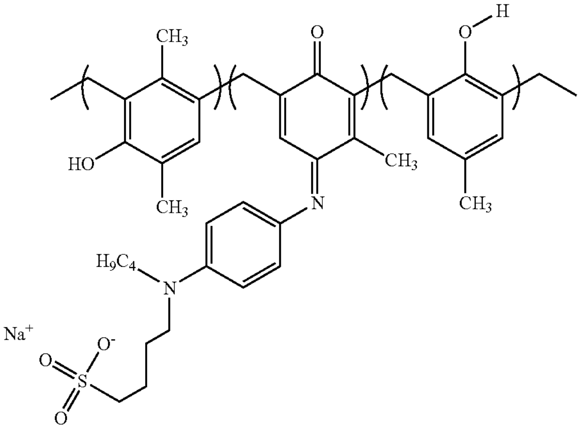

novolac III

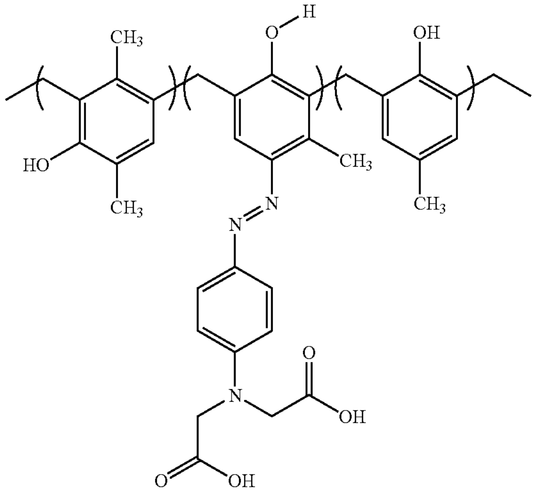

novolac IV

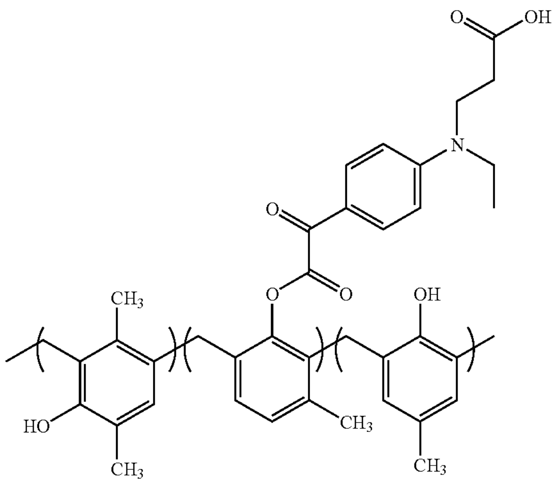

-continued novolac V

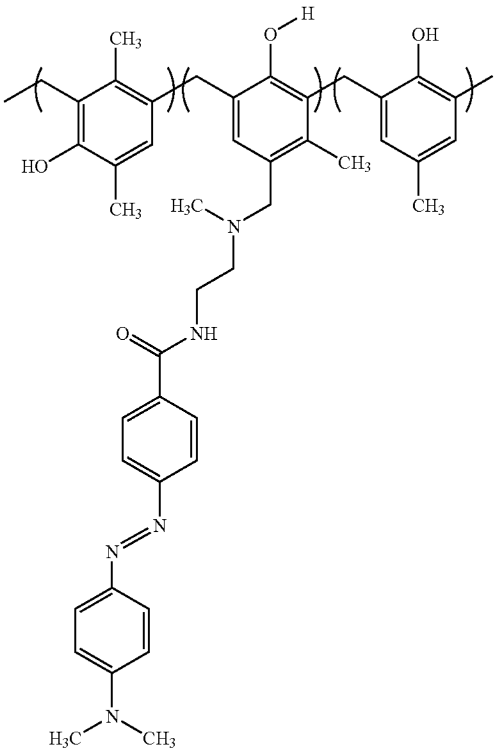

novolac VI

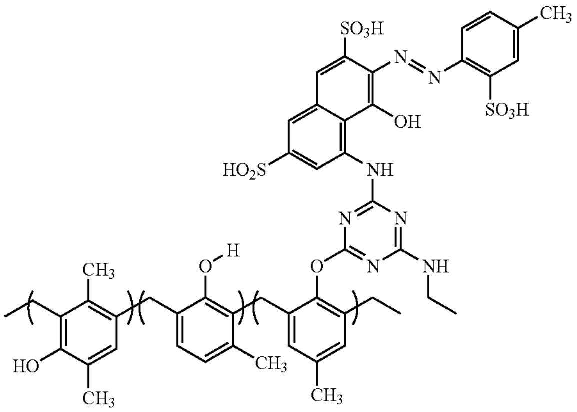

wherein each monomeric unit between brackets is present at least once.

The polymer can be prepared by any conventional polymerization procedure such as radical polymerization of vinylic monomers, cationic polymerization such as polymerization of vinyl ethers or ring opening polymerization of strained cyclic monomers such as epoxides, aziridines and azetidines, anionic polymerizations of e.g styrene derivatives or typical polycondensations as known for the preparation of polyesters, polyurethanes, phenol-formaldehyde resins, cresol-formaldehyde resins or urea- and melamine-formaldehyde resins. The polymers can also be prepared by recently introduced techniques of so-called "living radical polymerization".

In a particular embodiment, the polymer dye can be prepared by (co-)polymerization of dye monomers, such as dye containing methacrylates or acrylates, styrene derivatives, methacrylamides or acrylamides. Some examples of typical dye monomers useful for the preparation of polymers according to the present invention are the following:

monomer I

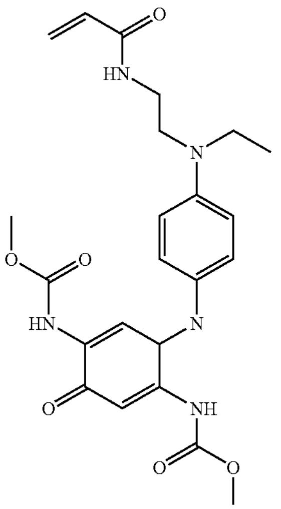

monomer II

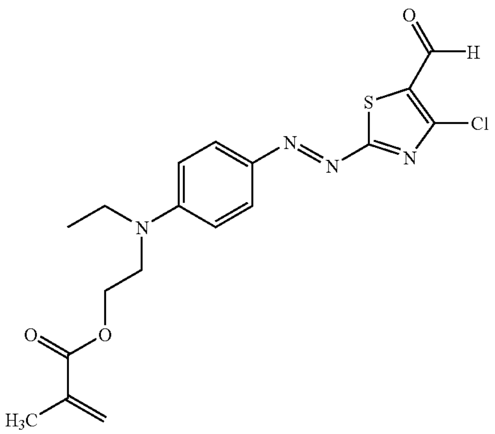

monomer III

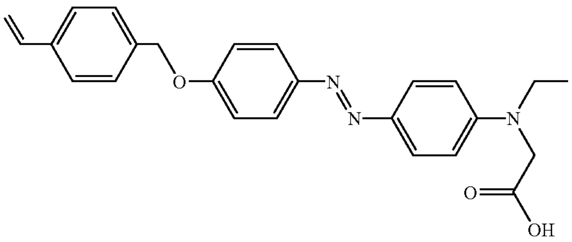

-continued monomer IV

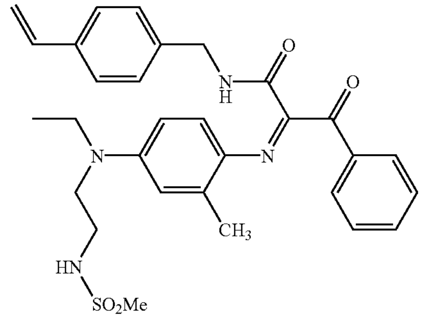

monomer V

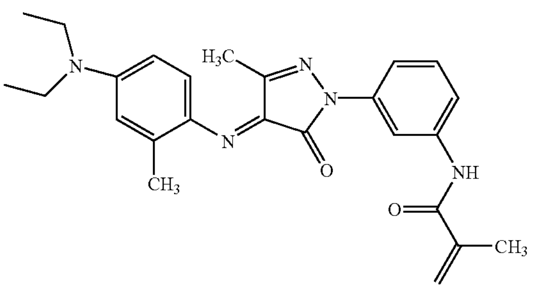

monomer VI

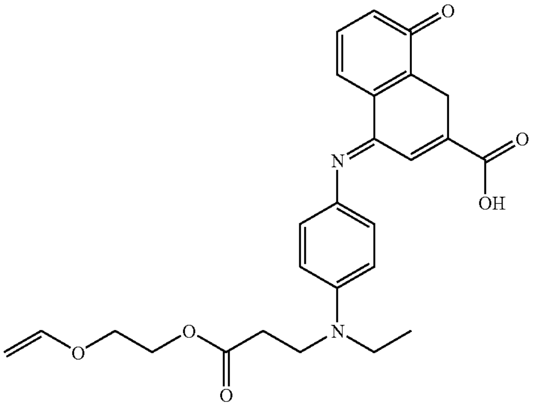

monomer VII

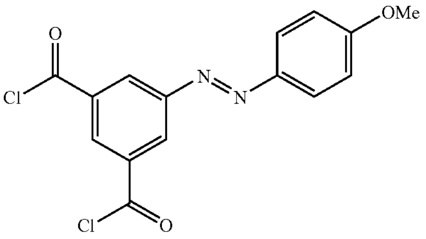

Alternatively, dyes can be coupled to an alkaline soluble polymer, hereafter referred to as polymer modification, by a wide variety of reactions, such as esterification of polyols and coupling of polymeric anhydrides with dye-amines or alcohols. Suitable polymer modification reactions for coupling a dye to a novolac resin involve alkylation or acylation of the phenolic hydroxy group and Mannich type reactions on the aromatic ring. Particularly useful is dyes for alkylating the phenolic functional groups are chlorotriazine and vinylsulfone reactive dyes. Typical examples of modified novolacs, illustrated with cresol resins, are novolac I to VI shown above.

A chromophoric group can also be coupled onto the polymer by other methods, e.g. as illustrated by the scheme below showing two preferred routes for the modification of a phenolic resin such as a novolac, wherein R represents the chromophoric group:

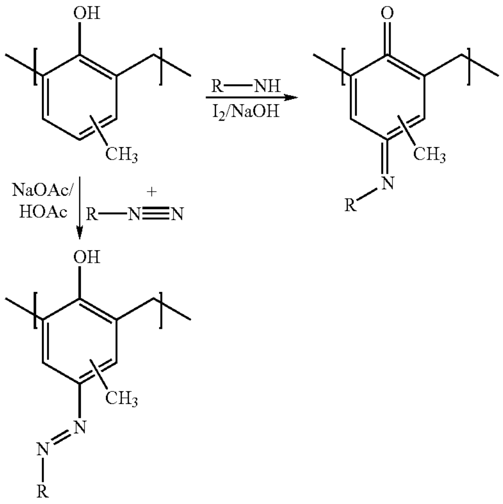

According to the present invention, the above polymer is used in the coating of a lithographic printing plate precursor. According to one embodiment, the printing plate precursor is positive-working, i.e. after exposure and development the exposed areas of the oleophilic layer are removed from the support and define hydrophilic, non-image (non-printing) areas, whereas the unexposed layer is not removed from the support and defines an oleophilic image (printing) area. According to another embodiment, the printing plate precursor is negative-working, i.e. the image areas correspond to the exposed areas.

The support has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel.

A particularly preferred lithographic support is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm.

The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

It is particularly preferred to use a film support to which an adhesion improving layer, also called support layer, has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg/$m^2$ and 750 mg/$m^2$. Further, the ratio of silica to hydrophilic binder is preferably more than 1 and the surface area of the colloidal silica is preferably at least 300 $m^2$/gram, more preferably at least 500 $m^2$/gram.

Besides the above discussed polymer, the coating of the precursor, and more particularly the oleophilic layer may contain additional binders that are soluble in an aqueous alkaline developer. Preferred binders are hydrophobic or oleophilic polymers such as the known phenolic resins, polyvinyl phenols and carboxy-substituted polymers. Typical examples of such polymers are described in DE-A-4007428, DE-A-4027301 and DE-A-4445820.

The oleophilic layer may further contain other ingredients, e.g. additional binders to improve the run length of the plate. Development accelerators as described in e.g. EP-A933 682 can also be included, i.e. compounds which act as dissolution promoters because they are capable of reducing the dissolution time of the oleophilic layer. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydrophthalic anhydride, tetrachlorophthalic anhydride, maleic anhydride, chloromaleic anhydride, alpha -phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the image forming composition is preferably in the range of 0.05 to 20% by weight.

In a preferred embodiment, the coating also contains developer resistance means, also called development inhibitors, i.e. one or more compounds which are capable of increasing the developer immersion time that is required to complete the dissolution during processing of the printing areas of the coating, i.e. the exposed areas in the negative-working embodiment and the non-exposed areas in the positive-working embodiment. Such developer resistance means can be added to the oleophilic layer or to another layer of the material. The simultaneous addition of dissolution inhibitors and accelerators allows a precise fine tuning of the dissolution behavior of the coating.

The compounds described in e.g. EP-A823 327 and WO97/39894 act as dissolution inhibitors due to interaction, e.g. by hydrogen bridge formation, with the alkali-soluble binder(s) in the coating. Other compounds improve the developer resistance because they delay the penetration of the aqueous alkaline developer into the oleophilic layer. Such compounds can be present in the oleophilic layer itself, as described in e.g. EP-A950 518, or can form a barrier layer on top of the oleophilic layer, as described in e.g. EP-A864 420, EP-A950 517 and WO99/21725. In the latter embodiment, the solubility of the barrier layer in the developer or the penetrability of the barrier layer by the developer can be increased (positive-working) or reduced (negative-working) by exposure to heat or infrared light.

Preferred examples of the developer resistance means for positive-working materials include water-repellent polymers such as a polymer comprising siloxane and/or perfluoroalkyl units. In one embodiment, the barrier layer contains such a water-repellent polymer in an amount between 0.5 and 25 $mg/m^2$, preferably between 0.5 and 15 $mg/m^2$ and most preferably between 0.5 and 10 $mg/m^2$. When the water-repellent polymer is also ink-repelling, e.g. in the case of polysiloxanes, higher amounts than 25 $mg/m^2$ can result in poor ink-acceptance of the non-exposed areas. An amount lower than 0.5 $mg/m^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellant polymer is a block-copolymer or a graft-copolymer of a poly(alkylene oxide) and a polymer comprising siloxane and/or perfluoroalkyl units. A suitable copolymer comprises about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, tends to position itself at the interface between the coating and air and thereby forms a separate top layer even when applied as an ingredient of the coating solution of the oleophilic layer. Simultaneously, such surfactants act as a spreading agent which improves the coating quality. Alternatively, the water-repellent polymer can be applied in a second solution, coated on top of the oleophilic layer. In that embodiment, it may be advantageous to use a solvent in the second coating solution that is not capable of dissolving the ingredients present in the first layer so that a highly concentrated water-repellent phase is obtained at the top of the material.

The heat-sensitive printing plate precursor of the present invention can be exposed directly, e.g. by means of a thermal head, or indirectly, i.e. by infrared light which is converted into heat by a light absorbing compound. Said light absorbing compound can be the chromophoric moiety discussed above. Alternatively, the coating preferably comprises, in addition to the chromophoric moiety, a sensitizer which is a dye or pigment, preferably having an absorption maximum in the near IR wavelength range (>750 nm). Although the chromophoric moiety absorbs visible light, it preferably does not sensitize the printing plate precursor, i.e. no substantial effect on the dissolution rate of the coating in the developer is induced by exposure to visible light. Most preferably, the coating is not sensitive to ambient daylight, i.e. visible (400–750 nm) and near UV light (300–400 nm) at an intensity and exposure time corresponding to normal working conditions so that the material can be handled without the need for a safe light environment. "Not sensitive" shall mean that no substantial change of the dissolution rate of the coating in the developer is induced by exposure to ambient daylight. In a preferred daylight stable embodiment, the coating does not comprise photosensitive ingredients, such as diazide or diazonium compounds, photoacids, photoinitiators, sensitizers etc., which absorb the near UV and/or visible light that is present in sun light or office lighting and thereby change the solubility of the coating in exposed areas.

The concentration of the sensitizing dye or pigment in the oleophilic layer is typically between 0.25 and 10.0 wt. %, more preferably between 0.5 and 7.5 wt. % relative to said layer. Preferred IR-absorbing compounds are dyes such as cyanine or merocyanine dyes or pigments such as carbon black. A suitable compound is the following infrared dye:

IR-1

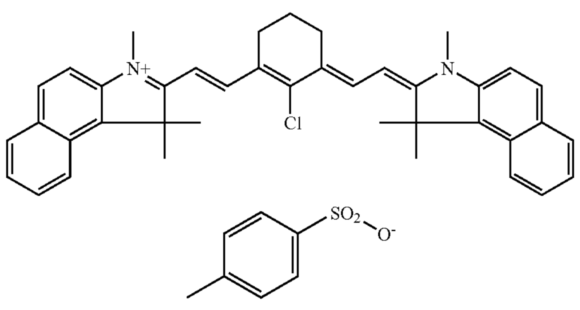

The sensitizing dye or pigment may be present in the oleophilic layer, in the barrier layer discussed above or in an optional other layer. According to a highly preferred embodiment, the dye or pigment is concentrated in or near the barrier layer, e.g. in an intermediate layer between the oleophilic and the barrier layer. According to that embodiment, said intermediate layer comprises the light absorbing compound in an amount higher than the amount of light absorbing compound in the oleophilic or in the barrier layer. In a preferred embodiment, the barrier layer consists essentially of water-repellent polymer, i.e. comprises no effective amount of sensitizer or other ingredients.

The printing plate precursor of the present invention can be exposed to heat or to infrared light, e.g. by means of a thermal head, LEDs or a laser. Preferably, one or more lasers are used which emit near infrared light having a wavelength in the range from about 750 to about 1500 nm, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10–25 μm), the scan speed and the resolution of the exposure apparatus (i.e. the number of addressable pixels per unit of linear distance, often expressed in dots per inch or dpi; typical value: 1000–4000 dpi).

Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. Nos. 5,174,205 and 5,163,368.

In the development step, the non-image areas of the coating are removed by immersion in an aqueous alkaline developer, which may be combined with mechanical rubbing, e.g. by a rotating brush. The development step may be followed by a rinsing step, a gumming step, a drying step and/or a post-baking step.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid inks which are suitable for use in the method of the present invention have been described in U.S. Pat. No. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

Example 1

Synthesis of Novolac I

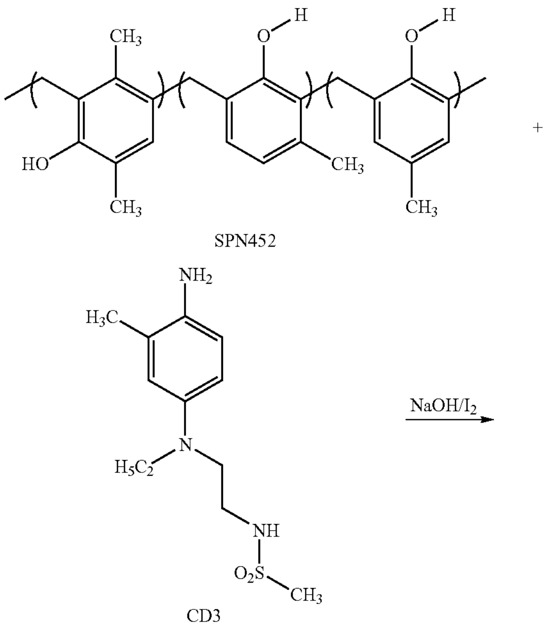

SPN452

CD3

-continued

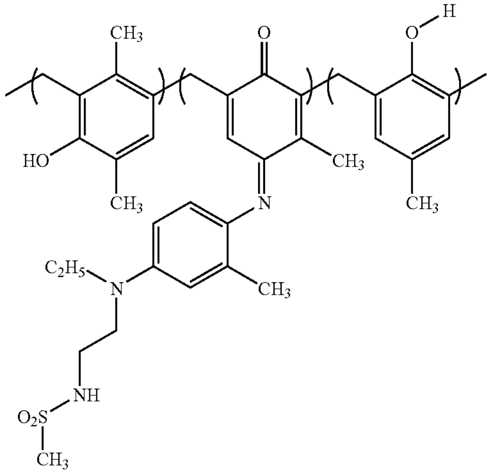

12.7 g (0.05 mol) of iodine and 10.9 g of CD3 (sulfate salt) were added to a solution of 300 g of Alnovol SPN452 in 300 ml 1-methoxy-2-propanol. 17.5 ml of a 10 N NaOH solution was added over 5 minutes. The reaction is slightly exothermic. The reaction mixture immediately starts turning blue. The reaction was allowed to continue for 3 hours at room temperature. After 3 hours, the reaction mixture was added to 2 liters water over 1 hour while continuously stirring. The polymer precipitated from the aqueous medium and was isolated by filtration. The polymer was washed 3 times with 300 ml water and dried.

Example 2

Synthesis of Novolac II

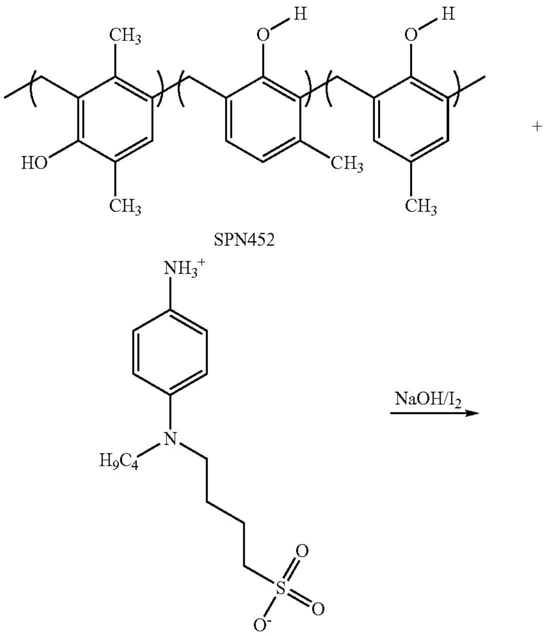

SPN452

-continued

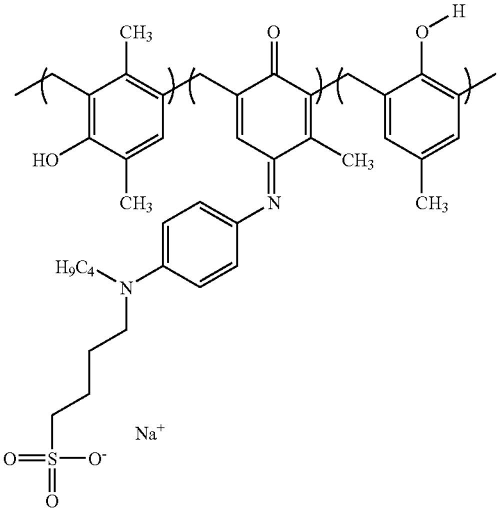

12.7 g (0.05 mol) of iodine and 8 g (0.025 mol) of N-butyl-N-sulfobutyl-p-phenylene diamine were added to a solution of 300 g of Alnovol SPN452 (a 40 wt. % solution of the cresol-formaldehyde resin in 1-methoxy-2-propanol) in 300 ml of 1-methoxy-2-propanol. 12.5 ml of a 10 N NaOH solution was added over 5 minutes. The reaction is slightly exothermic. Upon reaction, the reaction mixture becomes blue. The reaction was allowed to continue for 3 hours at room temperature. After 3 hours, the reaction mixture was added to 2 liter water over 50 minutes while stirring continuously. The polymer precipitated from the aqueous medium and was isolated by filtration. The polymer was washed 3 times with 300 ml water and dried.

Example 3–4

Preparation of a Lithographic Printing Plate Precursor

A coating solution was prepared by mixing the following ingredients:

| Ingredient | Example 3 | Example 4 |
|---|---|---|
| Tetrahydrofuran | 207 g | = |
| 1-methoxy-2-propanol | 359 g | = |
| Methyl ethyl ketone | 263 g | = |
| 2.0 wt. % solution of dye IR-1 (formula shown above) in 1-methoxy-2-propanol | 88.39 g | = |
| 3,4,5-trimethoxy cinnamic acid | 4.04 g | = |
| 1.0 wt. % solution of TEGO Glide 410 (commercially available from Tego Chemie Service GmbH) in 1-methoxy-2-propanol | 25.25 g | = |
| Novolac I | 51.52 g | — |
| Novolac II | — | 51.52 g |

The above solution was coated at a wet coating thickness of 22 μm on a electrochemically grained and anodized aluminum substrate. The coating was dried at 135° C. The printing plate precursor was then imaged on a Creo Trendsetter 3244 using an energy density of 125 $mJ/cm^2$. The plate was processed in an Autolith T processor operating at a speed of 0.96 m/min using Agfa developer Ozasol EP26 (25° C.). The plate was gummed with Ozasol RC795, also from Agfa. The processed plates did not show any dye stain in the non-image areas. The plate was mounted on a Heidelberg GTO52 printing press using K+E 800 Skinnex Black (commercially available from BASF) as ink and ROTAMATIC as fountain (commercially available from Unigraphica GmbH). Excellent copies were obtained.

What is claimed is:

1. A heat-sensitive lithographic printing plate precursor comprising (i) a support having a hydrophilic surface or which is provided with a hydrophilic layer and (ii) a coating provided thereon, wherein the coating comprises a polymer that is soluble in an aqueous alkaline solution and that comprises at least one chromophoric moiety having a light absorption maximum in the wavelength range between 400 and 750 nm, the chromophoric moiety having a structure according to any of the following formulae I to VI:

(I)

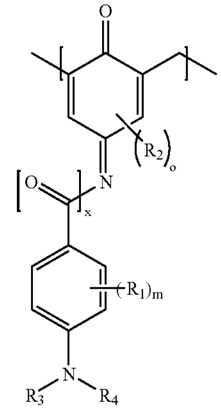

(II)

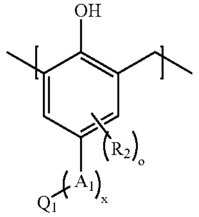

(III)

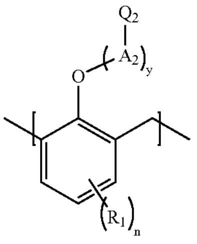

(IV)

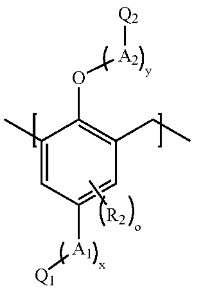

-continued (V)

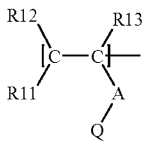

(VI)

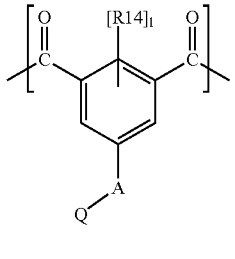

wherein
l is 0 to 3;
m 0 to 4;
n is 0 to 3;
o is 0 to 2;
x and y are independently 0 or 1;
each $R_1$ and $R_2$ is independently selected from the group consisting of alkyl, aryl, —$G_1$, —$L_1$—$G_1$, —CN, a halogen, —$NO_2$, —$OR_a$, —CO—$R_d$, —CO—O—$R_a$, —O—CO—$R_d$, —CO—$NR_dR_e$, —$NR_dR_e$, —$NR_d$—CO—$R_e$, —$NR_d$—CO—O—$R_a$, —$NR_d$—CO—$NR_eR_f$, —$SR_a$, —SO—$R_a$, —$SO_2$—$R_a$, —$SO_2$—O—$R_a$, —$SO_2$—$NR_aR_b$ or wherein two adjacent radicals $R_1$ together form a condensed carbocyclic or heterocyclic ring;
each $R_3$ and $R_4$ is independently selected from the group consisting of hydrogen, alkyl, aryl, —CO—$R_d$, —CO—O—$R_b$, —CO—$NR_gR_h$ and —$L_2$—$G_2$;
$R_{11}$, $R_{12}$ and $R_{13}$ are independently selected from the group consisting of hydrogen, alkyl or aryl;
each $R_{14}$ is independently selected from alkyl or aryl;
with
A, $A_1$, $A_2$, $L_1$ and $L_2$ being a divalent linking group;
$G_1$, $G_2$ and $G_3$ being a solubilizing group selected from —COOH, —$PO_3H_2$, —O—$PO_3H_2$, —$SO_3H$, —O—$SO_3H$, —$SO_2$—$NH_2$, —$SO_2$—NH—$R_c$, —$SO_2$—NH—CO—$R_c$ and salts thereof;
$R_a$, $R_b$ and $R_c$ being an alkyl or an aryl group;
$R_d$, $R_e$, $R_f$, $R_g$ and $R_h$ being hydrogen, an alkyl or an aryl group;
wherein the chromophoric Q, $Q_1$ and $Q_2$ are independently selected from the groups consisting of

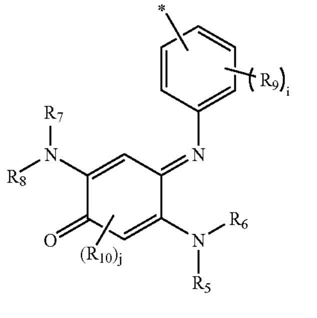

-continued

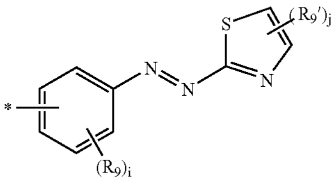

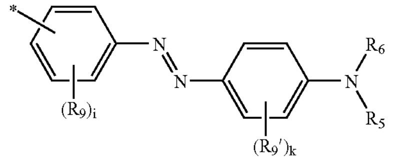

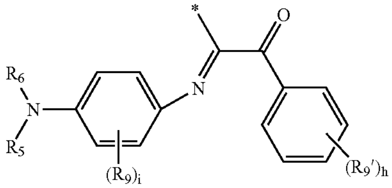

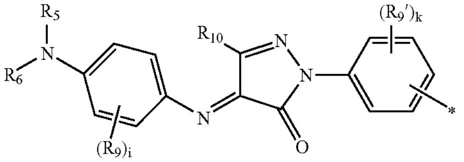

and

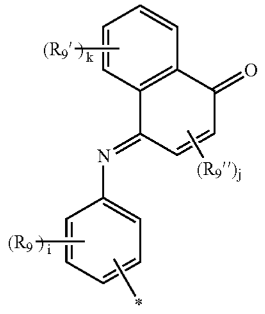

wherein
h is 0 to 5;
i and k are independently 0 to 4;
j is 0 to 2;
* represents the bond between the chromophoric group and the polymer;
each $R_9$, $R_9'$, $R_9'$ and $R_{10}$ is independently selected from the group consisting of alkyl, aryl, —$G_1'$, —$L_1'$—$G_1'$, —CN, a halogen, —$NO_2$, —$OR_a'$, —CO—$R_d'$, —CO—O—$R_a'$, —O—CO—$R_d'$, —CO—$NR_d'R_e'$, —$NR_d'R_e'$, —$NR_d'$—CO—$R_e'$, —$NR_d'$—CO—O—$R_a'$, —$NR_d'$—CO—$NR_e'R_f$, —$SR_a'$, —SO—$R_a'$, —$SO_2$—$R_a'$, —$SO_2$—O—$R_a'$, —$SO_2$—$NR_a'R_b'$ or wherein two adjacent radicals $R_9$, $R_9'$ or $R_9''$ together form a condensed carbocyclic or heterocyclic ring;
each $R_5$, $R_6$, $R_7$, and $R_8$ is independently selected from the group consisting of hydrogen, alkyl, aryl, —CO—$R_d'$, —CO—O—$R_b'$, —CO—$NR_g'R_h'$ and —$L_2'$—$G_2'$;
with
$L_1'$ and $L_2'$ being a divalent linking group;
$G_1'$ and $G_2'$ being a solubilizing group selected from —COOH, —OH, —$PO_3H_2$, O—$PO_3H_2$, —$SO_3H$, —O—$SO_3H$, —$SO_2$—$NH_2$, —$SO_2$—NH—$R_c'$, —$SO_2$—NH—CO—$R_c'$ and salts thereof;
$R_a'$, $R_b'$ and $R_c'$ being an alkyl or an aryl group;

$R_d'$, $R_e'$, $R_f'$, $R_g'$ and $R_h'$ being hydrogen, an alkyl or an aryl group.

2. A heat-sensitive lithographic printing plate precursor comprising (i) a support having a hydrophilic surface or which is provided with a hydrophilic layer and (ii) a coating provided thereon, wherein the coating comprises a polymer tat is soluble in an aqueous alkaline solution and that comprises at least one chromophoric moiety having a light absorption maximum in the wavelength range between 400 and 750 nm, the chromophoric moiety having a structure according to any of the following formulae I to VI:

(I)

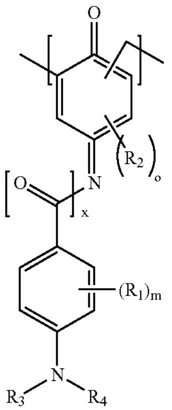

(II)

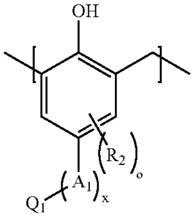

(III)

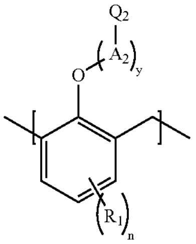

(IV)

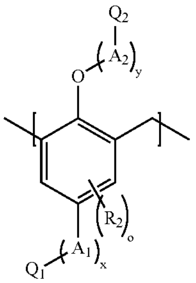

(V)

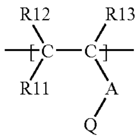

-continued (VI)

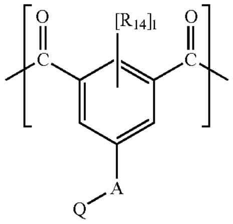

wherein is 0 to 3;

m is 0 to 4;

n is 0 to 3;

o is 0 to 2;

x and y are independently 0 or 1;

each $R_1$ and $R_2$ is independently selected from the group consisting of alkyl, aryl, $-G_1$, $-L_1-G_1$, $-CN$, a halogen, $-NO_2$, $-OR_a$, $-CO-R_d$, $-CO-O-R_a$, $-O-CO-R_d$, $-CO-NR_dR_e$, $-NR_dR_e$, $-NR_d-CO-R_e$, $-NR_d-CO-O-R_a$, $-NR_d-CO-NR_eR_f$, $-SR_a$, $-SO-R_a$, $-SO_2-R_a$, $-SO_2-O-R_a$, $-SO_2-NR_aR_b$ or wherein two adjacent radicals $R_1$ together form a condensed carbocyclic or heterocyclic ring;

each $R_3$ and $R_4$ is independently selected from the group consisting of hydrogen, alkyl, aryl, $-CO-R_d$, $-CO-O-R_b$, $-CO-NR_gR_h$ and $-L_2-G_2$;

$R_{11}$, $R_{12}$ and $R_{13}$ are independently selected from the group consisting of hydrogen, alkyl or aryl;

each $R_{14}$ is independently selected from alkyl or aryl;

Q, $Q_1$ and $Q_2$ are chromophoric groups wherein $Q_2$ comprises at least one solubilizing group $G_3$;

with

A, $A_1$, $A_2$, $L_1$ and $L_2$ being a divalent linking group;

$G_1$, $G_2$ and $G_3$ being a solubilizing group selected from $-COOH$, $-PO_3H_2$, $-O-PO_3H_2$, $-SO_3H$, $-O-SO_3H$, $-SO_2-NH_2$, $-SO_2-NH-R_c$, $-SO_2-NH-CO-R_c$ and salts thereof;

$R_a$, $R_b$ and $R_c$ being an alkyl or an aryl group;

$R_d$, $R_e$, $R_f$, $R_g$ and $R_h$ being hydrogen, an alkyl or an aryl group;

the coating further comprising an oleophilic layer which, upon image-wise exposure to heat or infrared light and subsequent immersion in an aqueous alkaline developer, dissolves in the aqueous alkaline developer at a higher dissolution rate in exposed areas than in unexposed areas, and wherein the polymer is present in the oleophilic layer, the lithographic printing plate further comprising a barrier layer provided on the oleophilic layer, the barrier layer comprising means for providing resistance to the aqueous alkaline developer at unexposed areas and wherein the developer resistance of the coating is reduced upon exposure to beat or infrared light, and the solubility of the barrier layer by the developer is reduced upon exposure to heat or infrared light, and wherein the means for providing increased developer resistance at unexposed areas comprises a water-repellent polymer selected from the group consisting of a polymer comprising siloxane and/or perfluoroalkyl units; and a block- or graft-copolymer comprising (i) a poly(alkylene oxide) and (ii) a polymer comprising siloxane and/or perfluoroalkyl units.

3. A lithographic printing plate precursor according to claim 1 wherein the coating comprises an oleophilic layer which, upon image-wise exposure to heat or infrared light and subsequent immersion in an aqueous alkaline developer, dissolves in the aqueous alkaline developer at a higher dissolution rate in exposed areas than in unexposed areas.

4. A lithographic printing plate precursor according to claim 3 wherein the polymer is present in the oleophilic layer.

5. A lithographic printing plate precursor according to claim 4 wherein the coating further comprises means for providing increased resistance to the aqueous alkaline developer at unexposed areas and wherein the developer resistance of the coating is reduced upon exposure to heat or infrared light.

6. A lithographic printing plate precursor according to claim 5 wherein the means for providing increased developer resistance at unexposed areas arc present in a barrier layer provided on the oleophilic layer and wherein the solubility of the barrier layer in the developer or the penetratability of the barrier layer by the developer is reduced upon exposure to heat or infrared light.

* * * * *